United States Patent
Sato

(10) Patent No.: US 7,061,952 B2
(45) Date of Patent: Jun. 13, 2006

(54) OPTICAL MODULE AND OPTICAL DEVICE CONTROL CIRCUIT

(75) Inventor: Masahiro Sato, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 376 days.

(21) Appl. No.: 10/346,170

(22) Filed: Jan. 17, 2003

(65) Prior Publication Data

US 2003/0178615 A1    Sep. 25, 2003

(30) Foreign Application Priority Data

Jan. 18, 2002  (JP) ............................. 2002-010629
Jul. 26, 2002  (JP) ............................. 2002-218535

(51) Int. Cl.
*H01S 3/00* (2006.01)
*H01S 3/04* (2006.01)

(52) U.S. Cl. ............... 372/38.04; 372/38.1; 372/38.02; 372/34

(58) Field of Classification Search ............... 372/9, 372/29.021, 34, 38.1, 38.02, 38.04, 38.07, 372/43

See application file for complete search history.

(56) References Cited

U.S. PATENT DOCUMENTS

| | | | |
|---|---|---|---|
| 5,287,367 A * | 2/1994 | Yanagawa | 372/31 |
| 5,392,303 A * | 2/1995 | Shiozawa et al. | 372/32 |
| 6,522,675 B1 | 2/2003 | Tajima | |
| 2002/0009110 A1 * | 1/2002 | Inoue et al. | 372/38.04 |

* cited by examiner

*Primary Examiner*—Armando Rodriguez
(74) *Attorney, Agent, or Firm*—McDermott Will & Emery LLP

(57) ABSTRACT

An optical module includes a housing, a Peltier device, a semiconductor light-generating device, an optical waveguide, and a power supply circuit device. The housing has first and second power supply terminals. The Peltier device is provided in the housing. The semiconductor light-generating device is provided on the Peltier device. The optical waveguide is optically coupled to the semiconductor light-generating device. The power supply circuit device is provided in the housing and connected to the semiconductor light-generating device. The semiconductor light-generating device and Peltier device are connected in series between the first and second power supply terminals. In the light-generating module, current flows in one of the semiconductor light-generating device and the Peltier device, and then the current flows in the other of the semiconductor light-generating device and the Peltier device.

29 Claims, 9 Drawing Sheets

OPTICAL MODULE AND OPTICAL DEVICE CONTROL CIRCUIT

BACKGROUND OF THE INVENTION

1. Field of the Invention

The present invention relates to an optical module and an optical device control circuit for the optical module.

2. Related Background Art

An optical module generates an optical signal in response to an electric signal received. There are various types of such optical modules. An optical module of one type comprises a Peltier device, a semiconductor laser device provided on the Peltier device, and a circuit device for driving the semiconductor laser device. A light-generating module of another type comprises a Peltier device, a semiconductor optical amplifier provided on the Peltier device, an optical waveguide having a grating optically coupled to the semiconductor optical amplifier, and a circuit device for driving the semiconductor optical amplifier. The circuit device is connected to a power supply and a ground and is connected to the semiconductor optical amplifier for supplying a driving signal to the semiconductor optical amplifier. A light-generating module of still another type comprises a Peltier device, a semiconductor optical integrated device provided on the Peltier device, and a circuit device for driving the semiconductor optical integrated device. The semiconductor optical integrated device includes a semiconductor light-generating portion and a semiconductor modulation portion. The circuit device is connected to a power supply and a ground and is also connected to the semiconductor optical integrated device to supply a driving signal to the semiconductor modulation device.

SUMMARY OF THE INVENTION

In these light-generating modules, the Peltier device changes the temperature of the semiconductor light-generating device, such as a semiconductor laser device, semiconductor optical amplifier, and semiconductor optical integrated device. The Peltier device is controlled by a Peltier current control circuit device.

Each light-generating module includes a Peltier device and a semiconductor light-generating device. In the light-generating module, the Peltier device and semiconductor light-generating device is connected to respective power supplies. The light-generating module, therefore, consumes much power for the Peltier device and semiconductor light-generating device. That is, the present inventors have found that there is a technical improvement for a reduction in the power consumption of the light-generating module. The inventors think that the demand for this technical improvement may grow in a light-generating module in which a Peltier driver is enclosed.

It is, therefore, an object of the present invention to provide a light-generating module for reducing power consumption and to provide an optical device control circuit for the optical module.

One aspect of the present invention is directed to a control circuit for an optical module. The control circuit comprises first and second power supply lines, a semiconductor light-generating device, a power controller, and a Peltier device. The power controller controls a current flowing in the semiconductor light-generating device. The Peltier device operates to adjust the temperature of the semiconductor light-generating device. The semiconductor light-generating device and the Peltier device are connected in series between the first and second power supply terminals.

In this control circuit, a current flowing in one device of the semiconductor light-generating device and the Peltier device flows in the other device of the semiconductor light-generating device and the Peltier device.

In the control circuit, the power controller may include an output driver which supplies a current for the semiconductor light-generating device. The output driver is provided between the semiconductor light-generating device and the Peltier device. The output driver may include a modulation current circuit and a bias current circuit.

The control circuit may further comprise a Peltier driver. The Peltier driver is connected to a node which is connected to the semiconductor light-generating device. The Peltier device and the Peltier driver control a current flowing in the Peltier device. The Peltier driver enables to reuse a current flowing in the semiconductor light-generating device and to adjust a current flowing in the Peltier device.

In the control circuit, the Peltier driver may include a current supply, a current sink, and a controller. The current supply supplies a current to the node. The current sink sinks a current from the node. The controller controls the current supply and the current sink.

Another aspect of the present invention is directed to an optical module. The optical module comprises a housing, a Peltier device, a semiconductor light-generating device, an optical waveguide, and a power controller. The housing has first and second power supply terminals. The Peltier device is provided in the housing. The semiconductor light-generating device is provided on the Peltier device. The optical waveguide is optically coupled to the semiconductor light-generating device. The power controller is provided in the housing and connected to the semiconductor light-generating device. The semiconductor light-generating device and the Peltier device are connected in series between the first and second power supply terminals. The semiconductor light-generating device includes a semiconductor laser device.

The optical module includes a housing, a Peltier device, a semiconductor light-generating device, an optical waveguide, a grating, and a power controller. The grating is optically coupled to the optical waveguide. The semiconductor light-generating device includes a semiconductor optical amplifier.

The optical module includes a housing, a Peltier device, a semiconductor light-generating device, an optical waveguide, and a power controller. The semiconductor light-generating device includes a light-generating portion and a modulation portion. The modulation portion is optically coupled to the light-generating portion. The light-generating portion and the Peltier device are connected in series between the first and second power supply terminals.

In each of these optical modules, a current from the semiconductor light-generating device flows in the Peltier device. If the temperature of the semiconductor light-generating device falls, a current flowing in the semiconductor light-generating device decreases. Since this current flows in the Peltier device, the cooling capability of the Peltier device decreases. If the temperature of the semiconductor light-generating device rises, a current flowing in the semiconductor light-generating device increases. Since this current flows in the Peltier device, the cooling capability of the Peltier device increases. Therefore, the Peltier device lowers the temperature of the semiconductor light-generating device.

In the optical module and the control circuit, the power controller may include a driver which controls a current flowing in the semiconductor light-generating device. The driver is provided between the semiconductor light-generating device and the Peltier device. In the light-generating module, the driver may include a circuit for a modulation current and a circuit for a bias current.

The optical module may further comprise a Peltier driver connected to a node between the semiconductor light-generating device and the Peltier device. The Peltier driver adjusts a current flowing from the semiconductor light-generating device into the Peltier device.

The Peltier driver includes a current supply, a current sink, and a controller. The current supply is provided to supply a current to flow in the Peltier device. The current sink is provided to sink a current flowing in the semiconductor light-generating device. The controller is provided to control the current supply and the current sink. The controller in the Peltier driver can adjust a current flowing from the semiconductor light-generating device into the Peltier device by turning off at least one of the current supply and current sink.

The optical module may include a first semiconductor device, a second semiconductor device, and a controller. The first semiconductor device is connected to a node between the semiconductor light-generating device and the Peltier device to supply a current to the node. The second semiconductor device is connected to a node between the semiconductor light-generating device and the Peltier device to sink a current from the node. The controller can control a current flowing from the semiconductor light-generating device into the Peltier device by turning off at least one of the first and second semiconductor devices.

Still another aspect of the present invention is directed to a control circuit. The control circuit can be provided for an optical module. The control circuit comprises first and second power supply nodes, a light-generating circuit, and a Peltier device. The light-generating circuit includes at least one input, a semiconductor light-generating device having first and second terminals, a driver for generating a driving signal from a signal received at the input, and the driving signal is supplied to the first terminal of the semiconductor light-generating device. The Peltier device changes the temperature of the semiconductor light-generating device. The light-generating circuit and the Peltier device are connected between the first and second power supplies. The Peltier device and the light-generating circuit are connected in series with each other.

The control circuit according to the present invention has several embodiments described below. In a given embodiment of the control circuit, the light-generating circuit is connected between the first power supply and the intermediate node. The Peltier device is connected between the intermediate node and the second power supply. The second terminal of the semiconductor light-generating device is connected to the first power supply.

In another embodiment of the control circuit, the light-generating circuit is connected between the first power supply and the intermediate node. The Peltier device is connected between the intermediate node and the second power supply. The second terminal of the semiconductor light-generating device is connected to the intermediate node.

In still another embodiment of the control circuit, the light-generating circuit is connected between the second power supply and the intermediate node. The Peltier device is connected between the intermediate node and the first power supply. The second terminal of the semiconductor light-generating device is connected to the second power supply.

In still another embodiment of the control circuit and the optical module, the light-generating circuit is connected between the second power supply and the intermediate node. The Peltier device is connected between the intermediate node and the first power supply. The second terminal of the semiconductor light-generating device is connected to the intermediate node.

In these control circuits, a current flowing in one of the light-generating circuit and the Peltier device flows in the other of the light-generating circuit and the Peltier device.

In the control circuit according to the present invention, the light-generating circuit has first and second internal nodes. The driver is connected between the first internal node and the second internal node to receive power for the driver. The driver includes at least one input, an amplification circuit, a first transistor, a second transistor, a first circuit, a second circuit, a first output, a second output, and a bias-current/modulation-current controller. In the driver, the amplification circuit generates a pair of driving signals from a signal received at the input. Each of the first and second transistors has a control terminal and first and second terminals. The control terminal receives one of a pair of driving signals. Each of the first and second transistors can control a current flowing between the first and second terminals in response to a signal on the control terminal. The first circuit is connected to one of the first and second terminals of the first transistor and to one of the first and second current terminals of the second transistor. The first circuit generates a modulation current. The first output is connected to the other terminal of the first and second terminals of the first transistor. The second output is connected to the other terminal of the first and second terminals of the second transistor. The second circuit is connected to the first output and generates a bias current. The bias-current/modulation-current controller is connected to the first and second circuits and generates a signal for controlling a modulation current and a signal for controlling a bias current. The first terminal of the semiconductor light-generating device is connected to the first output. The second terminal of the semiconductor light-generating device is connected to the first internal line. The second output is connected to the first internal line.

In the control circuit and the optical module, a current flowing in one of the Peltier device and the driver and semiconductor light-generating device flows the other.

In the control circuit and the optical module, the light-generating device circuit may further include a load connected between the first internal line and the second output.

Still another aspect of the present invention is directed to an optical module. The optical module can be provided for a control circuit of an optical device. The optical module includes a housing, a Peltier device, a semiconductor light-generating device, a driver, and an optical waveguide. The housing has first and second power supply terminals. The Peltier device is provided in the housing. The semiconductor light-generating device is provided on the Peltier device. The driving device is connected to the semiconductor light-generating device. The optical waveguide is optically coupled to the semiconductor light-generating device.

In the control circuit and the optical module, the semiconductor light-generating device and the driver are connected in series to the Peltier device between the first and second power supply terminals. The semiconductor light-generating device includes a semiconductor laser element.

In the control circuit and the optical module, the semiconductor light-generating device and the driver are connected in series to the Peltier device between the first and second power supply terminals. The semiconductor light-generating device includes a semiconductor optical amplifier. The optical module further includes a grating optically coupled to the optical waveguide.

In the optical module, the semiconductor light-generating device can include a light-generating portion and a modulation portion optically coupled to the light-generating portion. The driver and the light-generating portion of the semiconductor light-generating device are connected in series to the Peltier device between the first and second power supply terminals.

In each of these optical modules, a current flowing through one of the Peltier device and the driver and semiconductor light-generating device flows into the other. A current flowing in the Peltier device is changed in response to variation in a current flowing in the semiconductor light-generating device and/or the driver.

In the optical module according to the present invention, the driver can be provided on the Peltier device. The Peltier device changes the temperature of the driver. If the driver consumes a greater current, the driver generates much more heat and a current flowing in the Peltier device increases. If a current flowing in the Peltier device increases, the cooling capability of the Peltier device increases. As a consequence, the Peltier device operates as to lower the temperature of the driver.

The foregoing and other objects, features, and advantages of the present invention will be apparent from the following more particular description of a preferred embodiment of the invention as illustrated in the accompanying drawings.

DETAILED DESCRIPTION OF THE PREFERRED EMBODIMENTS

Figure 1:
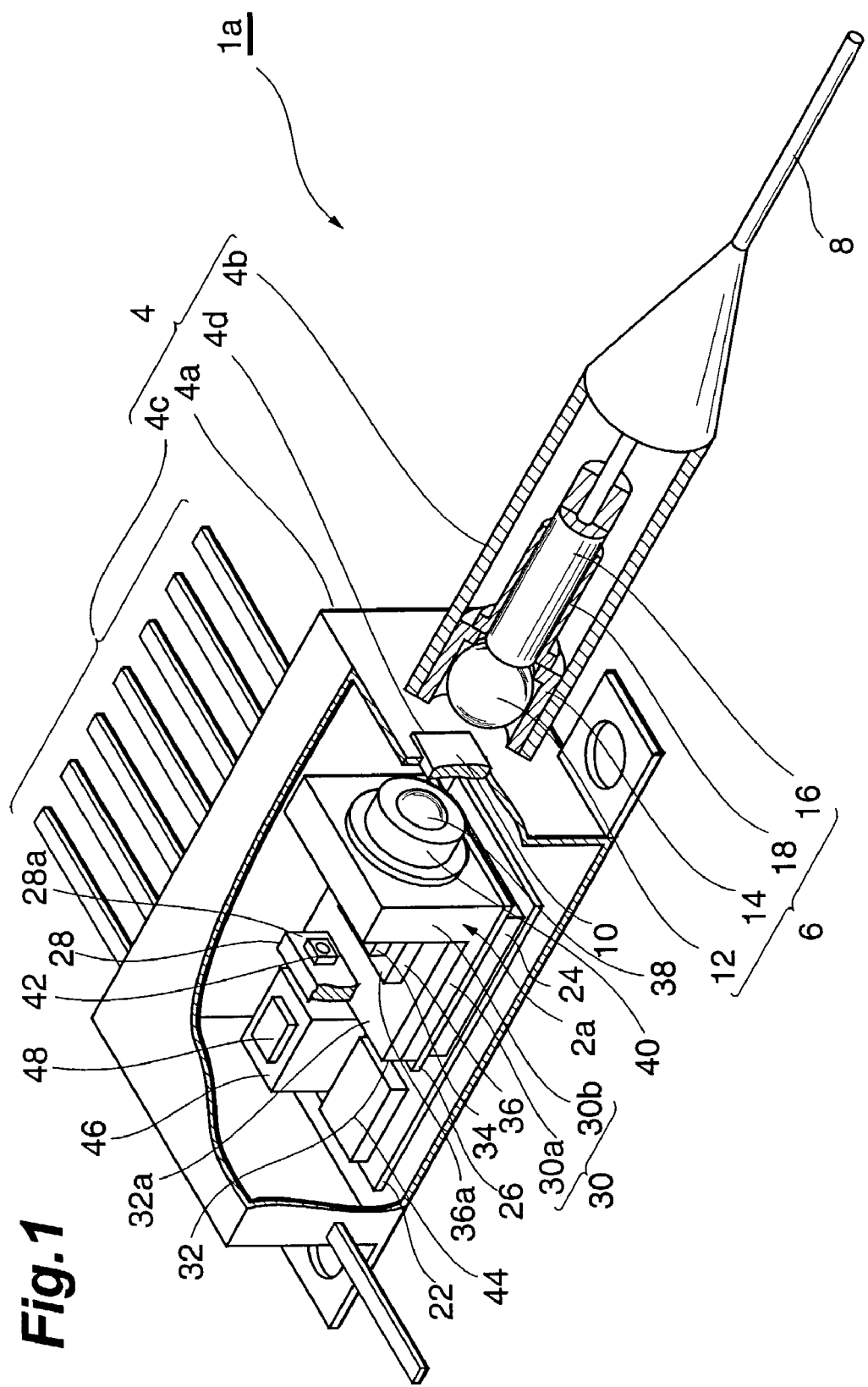
FIG. 1 is a perspective view showing a semiconductor laser module.

The present invention will be easily understood by considering the following detailed description together with the accompanying drawings. Identical reference numerals have been used, where possible, to designate identical elements that are common to the figures.

First Embodiment

FIG. 1 is a perspective view showing a light-generating module, such as a semiconductor laser module. A semiconductor laser module 1a includes an optical module primary portion (optical module primary part) 2a, a housing 4, an optical coupling portion 6, and an optical waveguide such as an optical fiber 8. The optical module primary portion 2a is provided in the housing 4, and generates a laser beam. An example of the housing 4 is a butterfly type package. The housing 4 has a body 4a, a support portion 4b for an optical fiber, a plurality of lead terminals 4c, and a window 4d for a light passage. Some of the lead terminals 4c are used as terminals of the first and second power supply. The body 4a provides a cavity for enclosing the primary portion 2a. The support portion 4b is provided on the front wall of the body 4a and supports the optical fiber 8 such that the primary portion 2a is optically coupled to the optical fiber 8. The lead terminals 4c are provided on side walls of the body 4a. The lead terminals 4c are electrically connected to the primary portion 2a. The window 4d is provided in the front wall of the body 4a. Light from the primary portion 2a passes through the window 4d to the support portion 4b. Hermetic glass 10 is fitted in the window 4d to seal the space airtightly.

The optical coupling portion 6 includes a lens 12, a lens holder 14, a ferrule 16, and a ferrule holder 18. The optical coupling portion 6 is provided in the support portion 4b. The lens holder 14 is provided in the support portion 4b. The ferrule holder 18 is secured to the lens holder 14. The ferrule holder 18 receives the ferrule 16 therein. The ferrule 16 holds the optical fiber 8. The lens holder 14 holds the lens 12 to optically couple the primary portion 2a to one end of the optical fiber 8. With the arrangement of the lens 12, the lens holder 14, the ferrule 16, and the ferrule holder 18, light from the primary portion 2a is incident on the optical fiber 8.

Subsequently, the primary portion 2a will be described in detail. The primary portion 2a has a thermoelectric cooling device, such as a Peltier device 24. The Peltier device 24 is provided on a substrate 22. A mount member 30 is mounted on the Peltier device 24. The Peltier device 24, working as a controlling device of temperature, is used to change the temperature of the semiconductor light-generating device 34, such as a semiconductor laser device.

A mount member 30, such as an L carrier, is mounted on the Peltier device 24. The mount member 30 has a portion 30a for mounting the device and a portion 30b for holding a lens. A mount member 36, such as a chip carrier, is mounted on the portion 30a through a mount member 32 therebewteen. A semiconductor light-generating device 34 is placed on a mount surface 36a of the mount member 36. The semiconductor light-generating device 34 has a semiconductor light-generating layer provided between a p-type cladding layer and an n-type cladding layer.

In the embodiment shown in FIG. 1, the Peltier device 24 and semiconductor light-generating device 34 are connected between the first and second power supplies.

The mount member 36 is provided on a mount surface 32a of the mount member 32. A lens holder 40 holds a lens 38 and is secured to the portion 30b for holding a lens. The lens 38 is positioned so as to receive light from the semiconductor light-generating device 34 and to provide light from the semiconductor light-generating device 34 to one end of the optical fiber 8 via the lens 12.

Another mount member 28 is provided on the mount surface 32a of the mount member 32. A semiconductor light-receiving device 42, such as a photodiode, is provided on a surface 28a of the mount member 28 to monitor light from the semiconductor light-generating device 34. With this arrangement of the above components 28, 32, and 42, the semiconductor light-receiving device 42 is optically coupled to the semiconductor light-generating device 34. The semiconductor light-receiving device 42 receives light from the semiconductor light-generating device 34 and generates an electric signal in response to the optical power generated by the semiconductor light-generating device 34.

In the housing 4, a Peltier driver 44 is placed on the substrate 22. The Peltier driver 44 is connected to the Peltier device 24 and controls an electric current flowing in the Peltier device 24. The housing 4 contains a power controller 48 provided on a mount member 46. The power controller 48 is connected to the semiconductor light-generating device 34 and generates a signal for driving the semiconductor light-generating device 34.

Figure 2:
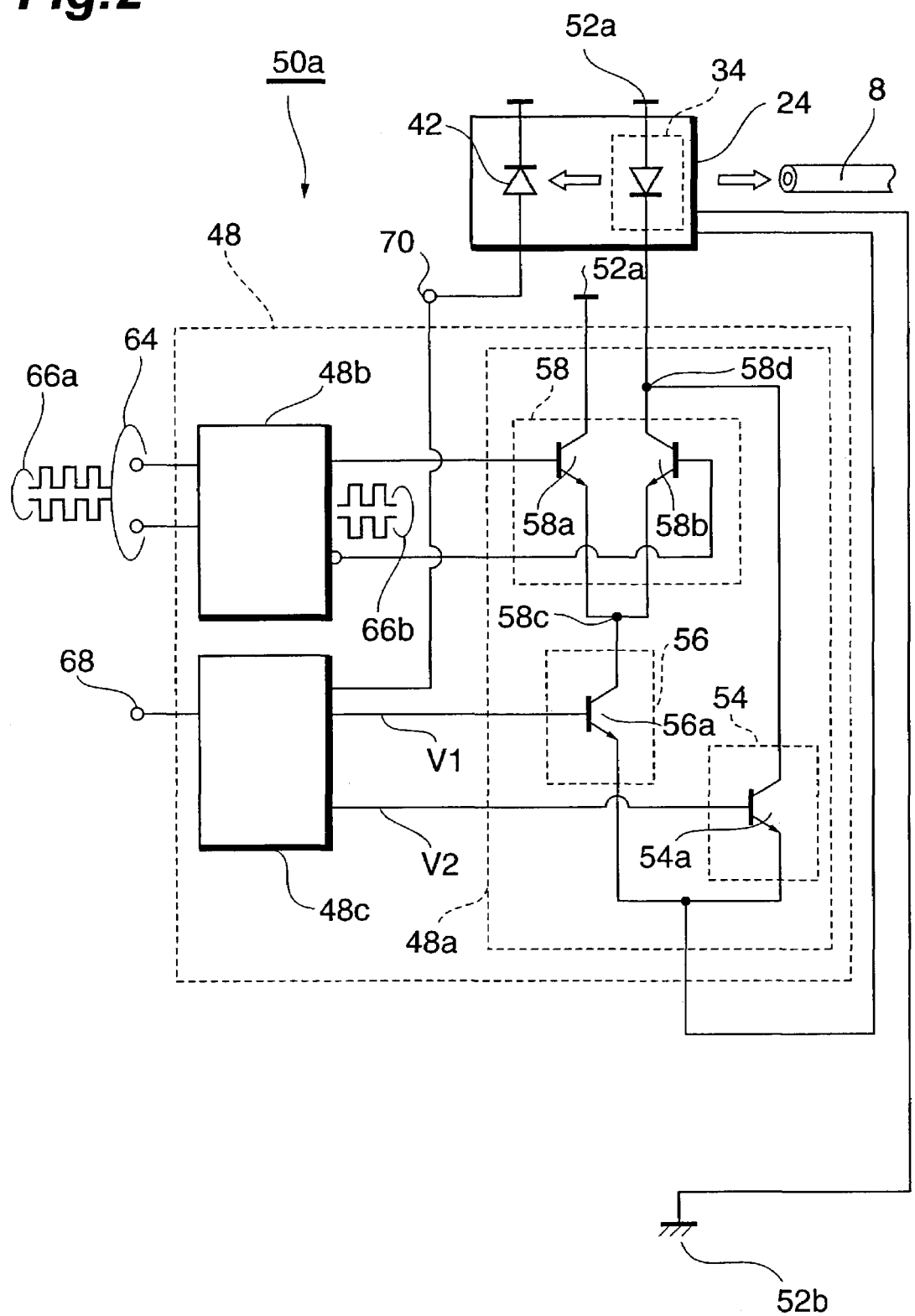
FIG. 2 is a circuit diagram showing a control circuit for the semiconductor laser module.

FIG. 2 is a circuit diagram showing an control circuit 50a for the semiconductor laser module 1a. The control circuit 50a includes the Peltier device 24, the semiconductor light-generating device 34, the semiconductor light-receiving device 42, and the power controller 48. The power controller 48 provides a driving signal for the semiconductor light-generating device 34. The Peltier device 24 is thermally coupled to the semiconductor light-generating device 34 so as to adjust the temperature of the semiconductor light-generating device 34. The Peltier device 24 can change the temperature of the semiconductor light-generating device 34. The semiconductor light-generating device 34, the power controller 48 and the Peltier device 24 are connected in series between a first power supply 52a and a second power supply 52b.

The power controller 48 includes an output driver 48a, an input driver 48b, and a bias-current/modulation-current controller 48c. The output driver 48a is connected between the semiconductor light-generating device 34 and the Peltier device 24. The output driver 48a controls an electric current flowing in the semiconductor light-generating device 34. The output driver 48a has a bias current driver 54, a modulation current driver 56, and a paired transistor portion 58. The paired transistor portion 58 includes first and second transistors 58a and 58b. Current terminals (emitters) of first and second transistors 58a and 58b are connected to a common node 58c. The control terminals (bases) of the first and second transistors 58a and 58b receive respective complementary signals from the signal driver 48b. The other terminal (collector) of the first transistor 58a is connected to the first power supply 52a. The other terminal (collector) of the second transistor 58b is connected to one of the anode and cathode of the semiconductor light-generating device 34. The other of the anode and cathode of the semiconductor light-generating device 34 is connected to the first power supply 52a.

The bias-current/modulation-current controller 48c receives a control signal from a terminal 68, and receives a signal from the light-receiving device 42 via a terminal 70. The bias-current/modulation-current controller 48c generates a signal V2 for controlling a bias current and a signal V1 for controlling a modulation current.

The signal driver 48b receives complementary signals 66a via input terminals 64. The signal driver 48b amplifies the received complementary signal 66a, and supplies an amplified signal 66b to the paired transistor portion 58.

The bias current driver 54 is connected between a node 58d and the Peltier device 24. The bias current driver 54 includes a transistor 54a. One terminal (collector) of the transistor 54a is connected to one of the anode and cathode of the semiconductor light-generating device 34. The other terminal (emitter) of the transistor 54a is connected to the Peltier device 24. The control terminal (base) of the transistor 54a receives the signal V2 from the bias-current/modulation-current controller 48c. The transistor 54a generates a bias current in response to the signal V2 from the power controller 48.

The modulation current driver 56 is connected between the semiconductor light-generating device 34 and the Peltier device 24. The modulation current driver 56 includes a transistor 56a. One terminal (collector) of the transistor 56a is connected to the node 58c. The other terminal (emitter) of the transistor 56a is connected to the Peltier device 24. The control terminal (base) of the transistor 56a receives the control signal V1 from the bias-current/modulation-current controller 48c. The transistor 56a generates a modulation current in response to the control signal V1 from the bias-current/modulation-current controller 48c.

In this optical device controller 50a, a current flowing in one of the semiconductor light-generating device 34 and Peltier device 24 flows in the other device of the semiconductor light-generating device 34 and Peltier device 24. The rise in the temperature of the semiconductor light-generating device 34 can be suppressed without using any temperature sensor or Peltier device control device.

In the semiconductor laser module 1a shown in FIGS. 1 and 2, an electric current from the semiconductor light-generating device 34 flows in the Peltier device 24. Under a control in which the power controller 48 controls the optical output of the semiconductor light-generating device 34 such that this optical output is changed toward a predetermined value, the electric current flowing in the semiconductor light-generating device 34 is reduced as the temperature of the semiconductor light-generating device 34 decreases. Since the current from the semiconductor light-generating device 34 flows into the Peltier device 24, the cooling capability of the Peltier device 24 decreases. In addition, the electric current flowing in the semiconductor light-generating device 34 increases as the temperature of the semiconductor light-generating device 34 increases. Since the electric current from the semiconductor light-generating device 34 flows into the Peltier device 24, the cooling capability of the Peltier device 24 increases. Therefore, the Peltier device 24 operates to lower the temperature of the semiconductor light-generating device 34.

Second Embodiment

Figure 3:
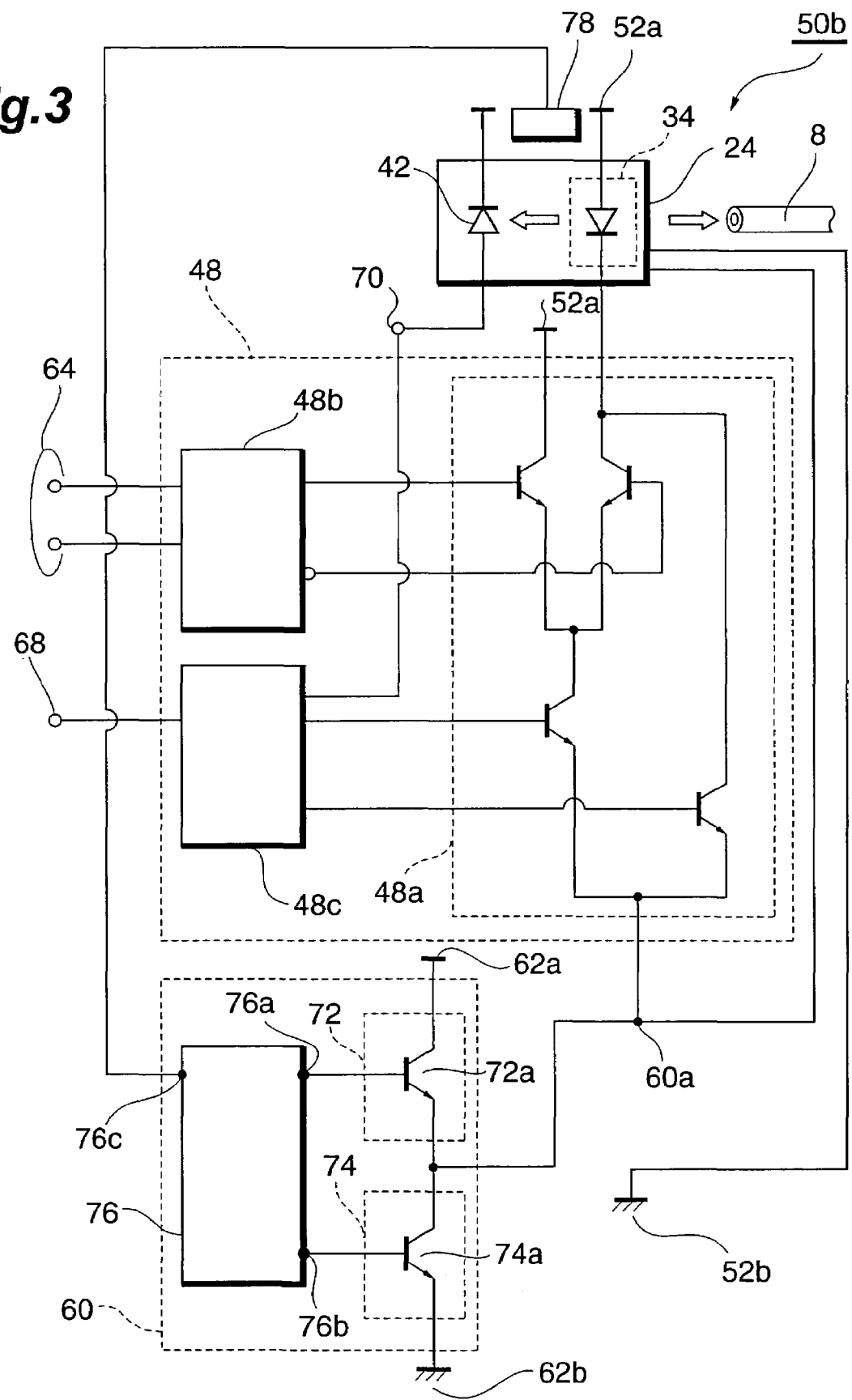
FIG. 3 is a circuit diagram showing a control circuit for the semiconductor laser module.

FIG. 3 is a circuit diagram showing an optical device controller 50b for a semiconductor laser module 1a. The optical device controller 50b includes a Peltier device 24, a semiconductor light-generating device 34, a semiconductor light-receiving device 42, a power controller 48, a Peltier driver 60, and a temperature sensor 78. The Peltier driver 60 is connected to a node 60a between the semiconductor light-generating device 34 and the Peltier device 24. The Peltier driver 60 controls an electric current flowing in the Peltier device 24 so as to change the temperature of the semiconductor light-generating device 34 in response to a signal from the temperature sensor 78. The Peltier driver 60 enables to reuse an electric current flowing in the semiconductor light-generating device 34 and to adjust an electric current flowing in the Peltier device 24.

The Peltier driver 60 may have a current supply 72, a current sink 74, and a controller 76. The current supply 72 supplies an electric current to flow in the Peltier device 24.

The current sink 74 sinks a current flowing in the semiconductor light-generating device 34. The controller 76 controls the current supply 72 and current sink 74 in response to a signal from the temperature sensor 78, such as thermistor. The current supply 72 and the current sink 74 are connected in series between a first power supply 62a and a second power supply 62b. The current supply 72 and the current sink 74 are connected to the node 60a. The current supply 72 includes a semiconductor device, such as a transistor 72a. This semiconductor device works as a switch in response to a control signal from the controller 76. One terminal (collector) of the transistor 72a is connected to the first power supply 62a. The other terminal (emitter) of the transistor 72a is connected to the node 60a. The control terminal (base) of the transistor 72a is connected to a first output terminal 76a of the controller 76. The current sink 74 includes a transistor 74a. One terminal (emitter) of the transistor 74a is connected to the second power supply 62b. The other terminal (collector) of the transistor 74a is connected to the node 60a. The control terminal (base) of the transistor 74a is connected to a second output terminal 76b of the controller 76. The controller 76 receives a signal from the temperature sensor 78 at a terminal 76c. In response to the signal received, the controller 76 generates the first and second outputs 76a and 76b. The transistors 72a and 74a adjust a current to the Peltier device 24 in response to the outputs 76a and 76b.

In this embodiment, since the semiconductor laser module has the temperature sensor, the semiconductor laser module can obtain a signal associated with the temperature of the semiconductor light-generating device 34. The temperature of the semiconductor light-generating device can be controlled toward a predetermined value by use of the signal. If a signal from the temperature sensor 78 indicates that the temperature of the semiconductor light-generating device 34 rises, the current supply 72 is switched on to supply an additional current to the Peltier device 24. An electric current to the Peltier device 24 increases, and rise in the temperature of the semiconductor light-generating device 34 is suppressed. If a signal from the temperature sensor 78 indicates that the temperature of the semiconductor light-generating device 34 falls, the current sink 74 is switched on to sink a current from the semiconductor light-generating device 34. A current to the Peltier device 24 decreases, and a fall in the temperature of the semiconductor light-generating device 34 is suppressed.

Third Embodiment

Figure 4A:
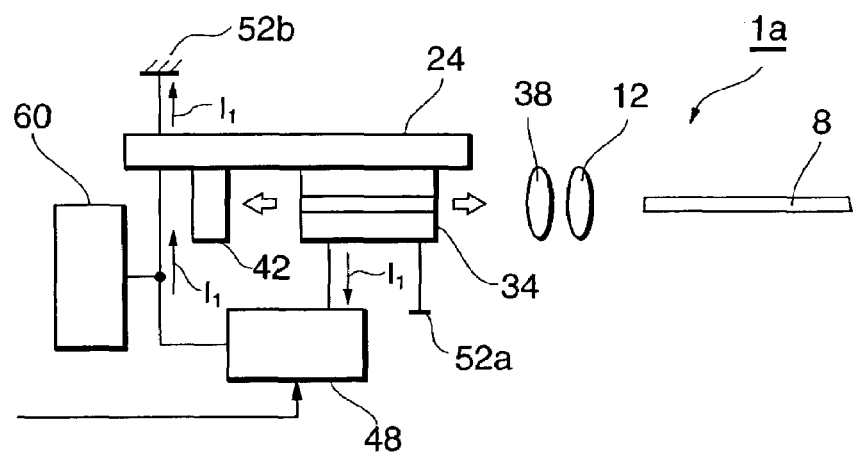
FIG. 4A is a schematic diagram of the semiconductor laser module shown in FIG. 1, and FIGS. 4B and 4C are schematic diagrams of other semiconductor laser modules for the control circuit shown in FIGS. 2 and 3.
Figure 4B:
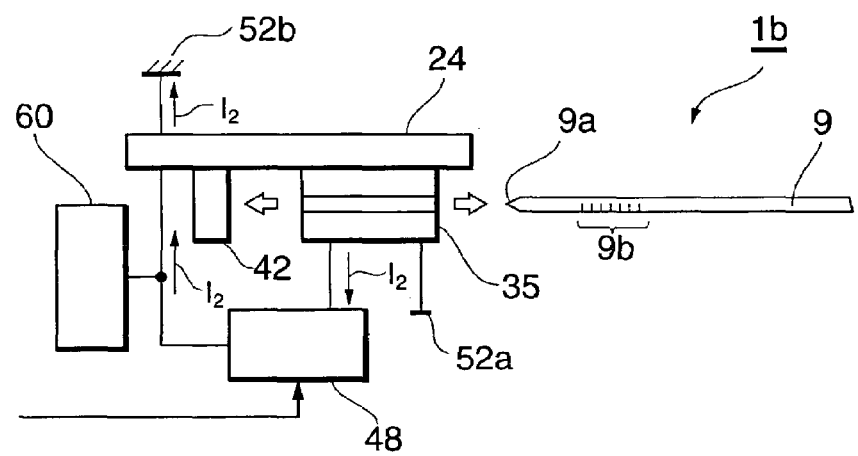
Figure 4C:
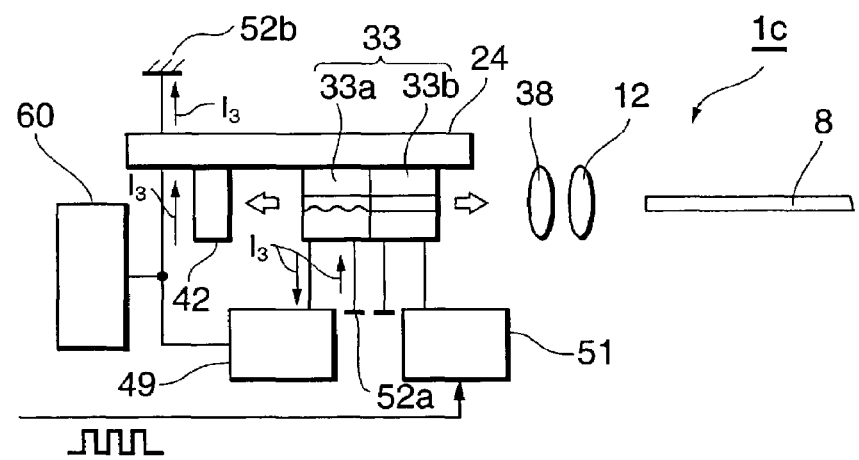

The embodiment of a light-generating module for an optical device controller will be described further. FIG. 4A is a schematic diagram of the semiconductor laser module shown in FIG. 1. FIGS. 4B and 4C are schematic diagrams of other semiconductor laser modules in which the optical device controllers shown in FIGS. 2 and 3 can be used.

FIG. 4A shows a semiconductor laser module 1a. In the semiconductor laser module 1a, the temperature of a semiconductor light-generating device 34, such as a semiconductor laser, is controlled by the Peltier device 24. An electric current $I_1$ flows in the semiconductor light-generating device 34. The current $I_1$ flows in a power controller 48 and the Peltier device 24.

FIG. 4B shows another semiconductor laser module 1b with an external cavity. In the semiconductor laser module 1b, the temperature of a semiconductor light-generating device 35, such as a semiconductor optical amplifier, is controlled by the Peltier device 24. An electric current $I_2$ flows in the semiconductor light-generating device 35. The current $I_2$ flows in the power supply controller 48 and the Peltier device 24. The semiconductor light-generating device 35 is optically coupled to one end 9a of an optical waveguide 9, such as a grating fiber. The optical waveguide 9 includes an optical grating 9b. The optical cavity is comprised of one end face of the semiconductor light-generating device 35 and the grating 9b.

FIG. 4C shows a semiconductor laser module 1c. In the semiconductor laser module 1c, the temperature of a light-generating device 33, such as a semiconductor optical integrated device, is controlled by the Peltier device 24. The semiconductor light-generating device 33 includes a laser portion 33a and a modulation portion 33b. The laser portion 33a generates unmodulated light. The modulation portion 33b is optically coupled to the laser portion 33a to modulate the light generated by the laser portion 33a. The modulated light is provided to an optical fiber 8. An electric current $I_3$ flows in the laser portion 33a. The current $I_3$ flows in a power supply controller 49 and the Peltier device 24.

As shown in FIGS. 4B and 4C, the light-generating module may include a Peltier driver 60. The light-generating modules shown in FIGS. 4B and 4C can be realized as shown in FIG. 1, but the present invention is not limited thereto. Although the light-generating modules have been described in the above embodiments, these light-generating modules may be configured to receive optical signals as well as generate optical signals. Furthermore, in the first to third embodiments, the power supply controller 48 may be mounted on the Peltier device 24.

Fourth Embodiment

In an optical module and an optical device controller according to this embodiment, a current flows in one of a Peltier device and a semiconductor light-generating device and driving circuit, and then the current also flows in the other of the Peltier device and the semiconductor light-generating device and driving circuit. If a current flowing in the semiconductor light-generating device and/or the driving circuit varies, a current flowing in the Peltier device is changed in response to the current variation. As a current flowing in the semiconductor light-generating device and/or the driving circuit increases, the cooling capability of the Peltier device increases, and vice versa.

Figure 5:
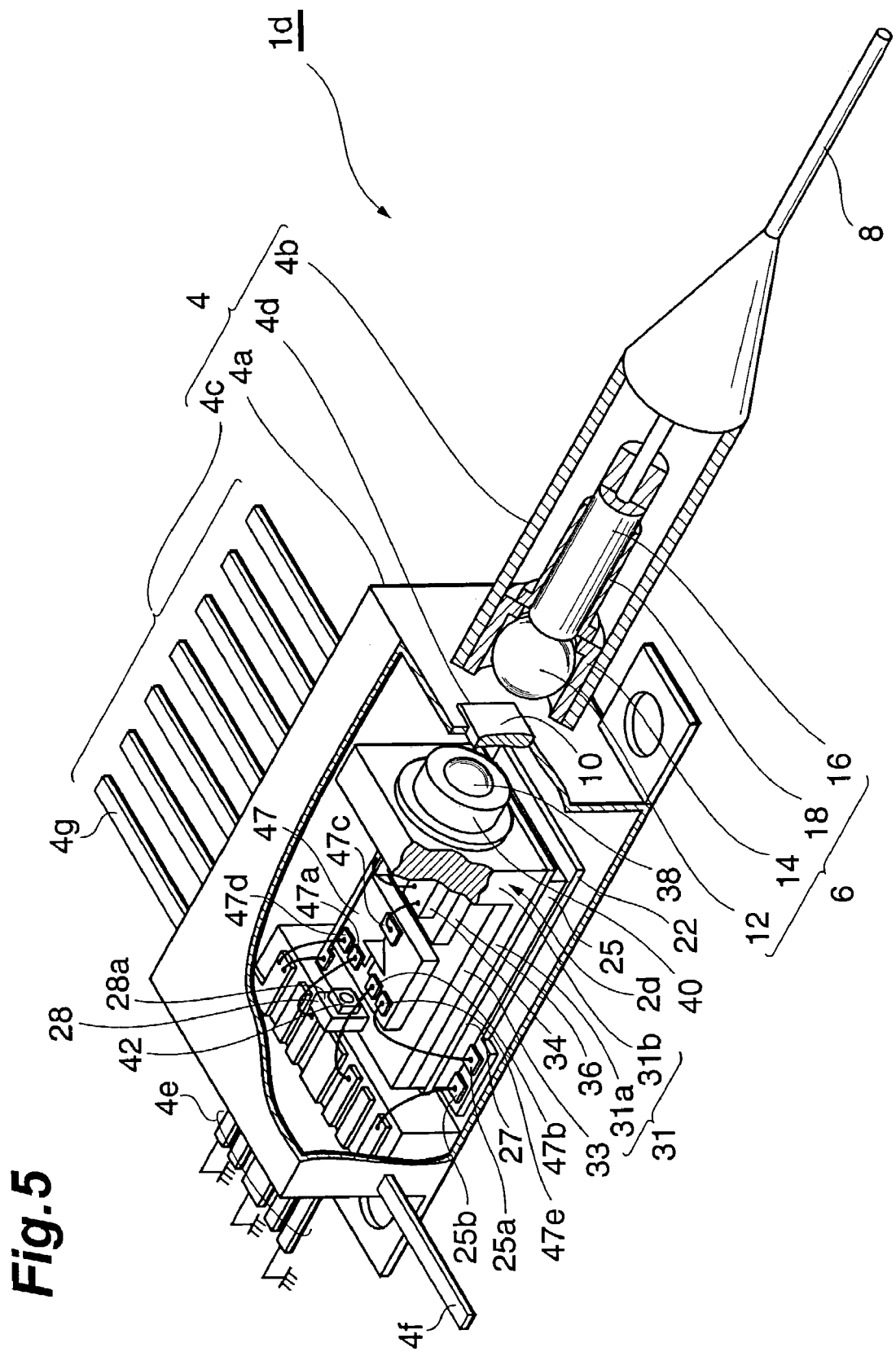
FIG. 5 is a perspective view showing a semiconductor laser module.

FIG. 5 is a perspective view showing an optical module, such as a semiconductor laser module. A semiconductor laser module 1d comprises a primary portion 2d, a housing 4, a coupling portion 6, and an optical waveguide, such as an optical fiber 8. The primary portion 2d is provided in the housing 4 and generates a laser beam. A lens holder 14 holds a lens 12 provided so as to optically couple the primary portion 2d to one end of the optical fiber 8. With this embodiment, light from the primary portion 2d is incident on the optical fiber 8.

The primary portion 2d will be described in detail. The mount member 31, such as an L carrier, includes a portion 31a for mounting a device and a portion 31b for holding a lens. A mount member 33 is mounted on the device mount portion 31a. A semiconductor light-generating device 34 is mounted on a mounting face of another mount member 36. A mount member 28 is mounted on a primary surface 33a of a mount member 33. A semiconductor light-receiving device 42, such as a photodiode, is provided on a surface 28a of the mount member 28 to monitor light from a semiconductor light-generating device 35, and the semiconductor light-receiving device 42 is optically coupled to the semiconductor light-generating device 35.

The primary portion 2d has a thermoelectric cooling device, such as a Peltier device 25, secured on the substrate 22. A mount member 27 is mounted on the Peltier device 25. The Peltier device 25, working as a thermoelectric cooler, changes the temperature of the semiconductor light-generating device 34a, such as a semiconductor laser. In the embodiment as shown in FIG. 5, the mount member 31 is mounted on the Peltier device 25.

The housing 4 contains a driving device 47 mounted on the mount member 33. The driver 47 is connected to the semiconductor light-generating device 34. The driver 47 receives, at inputs 47a and 47c, one or more signals from lead terminals 4e via bonding wires, and then provides, at an output 47c, a signal for driving the semiconductor light-generating device 34. The driver 47 has power terminals 47d and 47e for receiving power. The power terminal 47d is connected to a power supply 4g via a bonding wire. The terminal 47e is connected to one terminal 25a of the Peltier device 25 via a bonding wire. The other terminal 25b of the Peltier device 25 is connected to a power supply terminal 4f via a bonding wire. The semiconductor light-generating device 34 and the Peltier device 25 and driver 47 are therefore connected between the first power supply (lead terminal 4f) and the second power supply (lead terminal 4g).

In the optical module, a current flows in one of the Peltier device and the semiconductor light-generating device and driver. This current also is flows in the other of the Peltier device and the semiconductor light-generating device and driver. An optical module according to the above embodiment, therefore, provides the advantage in that the power consumption is reduced.

FIGS. 6A to 6D are views showing several examples which can be applied to the optical module shown in FIG. 5. Referring to FIGS. 6A to 6D, the semiconductor light-generating device 34 and the driver 47 constitute a control circuit.

Figure 6A:
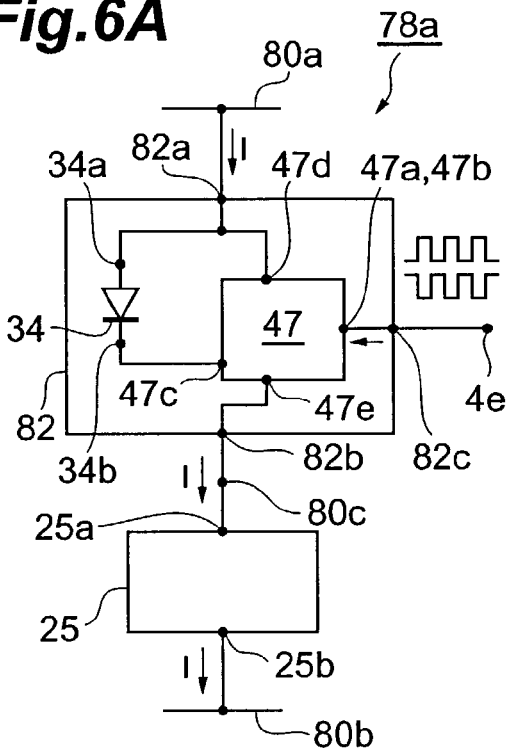
FIGS. 6A to 6D are schematic diagrams showing several configurations of a control circuit.

FIG. 6A is a circuit diagram of the control circuit for the optical module illustrated as an example in FIG. 5. A control circuit 78a includes a first power supply 80a, a second power supply 80b, an intermediate node 80c, a light-generating circuit 82, and the Peltier device 25.

The light-generating circuit 82 includes the semiconductor light-generating device 34, the driver 47, a first terminal 82a, a second terminal 82b, and signal inputs 82c. The first terminal 82a is connected to the first power supply 80a (power supply lead terminal 4g). The second terminal 82b is connected to the intermediate node 80c. The signal inputs 82c receive an input signal for the semiconductor light-generating device 34. The semiconductor light-generating device 34 has first and second terminals 34a and 34b, such as an anode and cathode. The driver 47 generates a signal for driving the semiconductor light-generating device 34 from signals received at one or more inputs 82c. The first terminal 82a is connected to the anode 34a of the semiconductor light-generating device 34 and the power terminal 47d of the driving circuit 47. The second current terminal 82b is connected to the terminal 47e of the driver 47. The cathode 34b of the semiconductor light-generating device 34 is connected to the output 47c of the driver 47. One terminal 25a of the Peltier device 25 is connected to the second terminal 82b via the intermediate node 80c. The other terminal 25b of the Peltier device 25 is connected to the second power supply 80b.

Figure 6B:
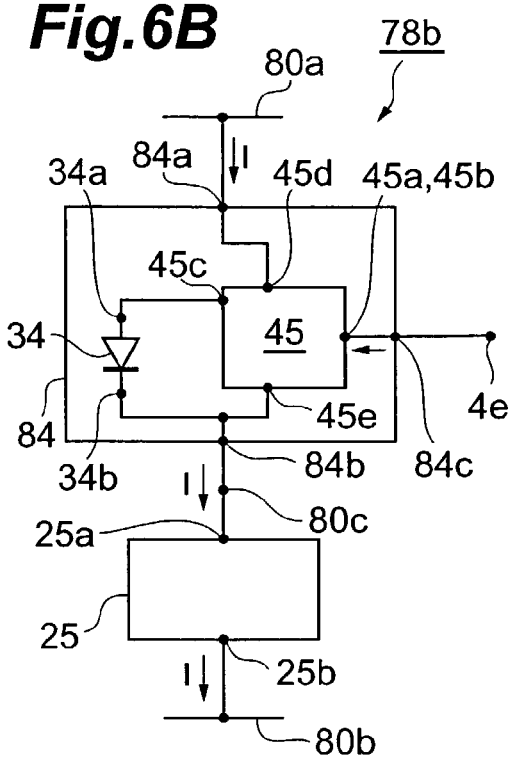

FIG. 6B is a circuit diagram of the modified control circuit for the optical module illustrated as an example in FIG. 5. A control circuit 78b includes the first power supply 80a, the second power supply 80b, the intermediate node 80c, a light-generating circuit 84, and the Peltier device 25.

The light-generating circuit 84 has the semiconductor light-generating device 34, a driver 45, a first terminal 84a, a second terminal 84b, and signal inputs 84c. The first terminal 84a is connected to the first power supply 80a (power supply lead terminal 4g). The second terminal 84b is connected to the intermediate node 80c. The signal inputs 84c receive input signals for the semiconductor light-generating device 34. The driver 45 generates a signal for driving the semiconductor light-generating device 34 from signals received at one or more inputs 84c. The first terminal 84a is connected to a terminal 45d of the driver 45. The second terminal 84b is connected to the cathode 34b of the semiconductor light-generating device 34 and a terminal 45e of the driver 45. The anode 34a of the semiconductor light-generating device 34 is connected to an output 45c of the driver 45. One terminal 25a of the Peltier device 25 is connected to the second terminal 84b via the intermediate node 80c. The other terminal 25b of the Peltier device 25 is connected to the second power supply 80b.

Figure 6C:
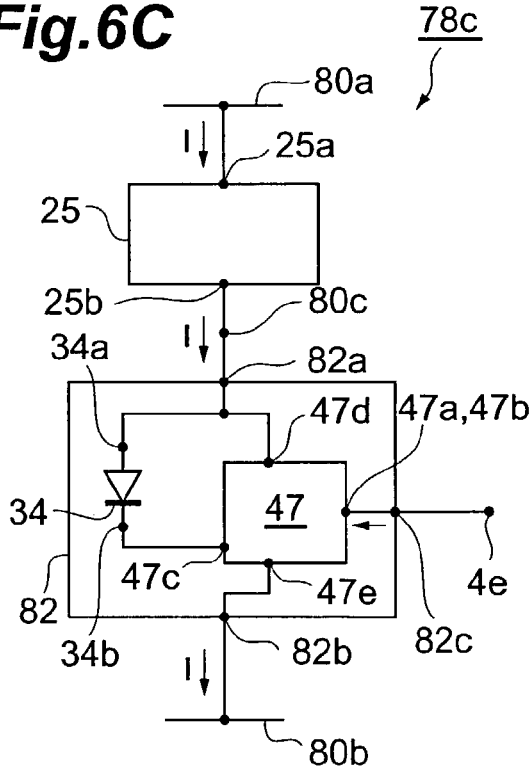

FIG. 6C is a circuit diagram of the modified control circuit for the optical module illustrated as an example in FIG. 5. An control circuit 78c includes the first power supply 80a, the second power supply 80b, the intermediate node 80c, the light-generating circuit 82, and the Peltier device 25.

One terminal 25a of the Peltier device 25 is connected to the first power supply 80a. The other terminal 25b of the Peltier device 25 is connected to the first terminal 82a via the intermediate node 80c. The light-generating circuit 82 includes the semiconductor light-generating device 34, the driver 47, the first terminals 82a and 82b, and the signal input 82c. The first terminal 82a is connected to the intermediate node 80c. The second terminal 82b is connected to the second power supply 80b. The signal inputs 82c receive input signals for the semiconductor light-generating device 34. The first terminal 82a is connected to the anode 34a of the semiconductor light-generating device 34 and the terminal 47d of the driver 47. The second current terminal 82b is connected to the terminal 47e of the driver 47. The cathode 34b of the semiconductor light-generating device 34 is connected to the output 47c of the driver 47.

Figure 6D:
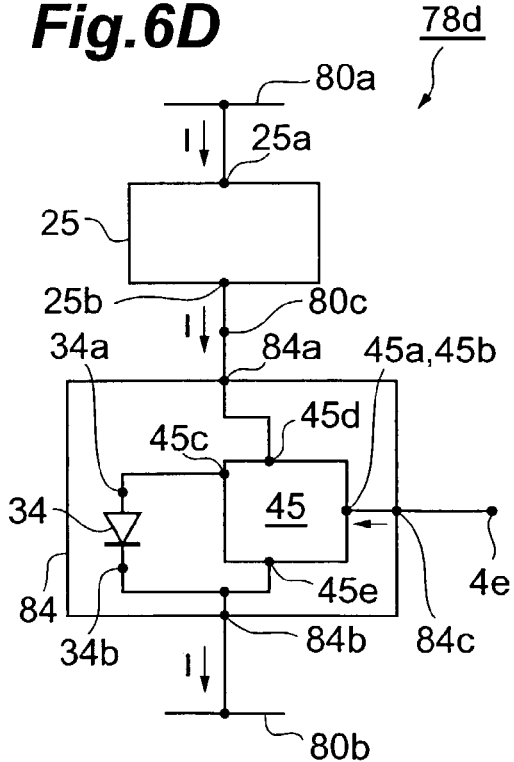

FIG. 6D is a circuit diagram of still another modified control circuit for the optical module illustrated as an example in FIG. 5. The control circuit 78d includes the first power supply 80a, the second power supply 80b, the intermediate node 80c, the light-generating circuit 84, and the Peltier device 25.

The light-generating circuit 84 includes the semiconductor light-generating device 34, the driver 45, the first terminal 84a, the second terminal 84b, and the signal input 84c. The first terminal 84a is connected to the intermediate node 80c. The second terminal 84b is connected to the second power supply 80b. The signal inputs 84c receive input signals for the semiconductor light-generating device 34.

One terminal 25a of the Peltier device 25 is connected to the first power supply 80a. The other terminal 25b of the Peltier device 25 is connected to the first terminal 84a via the intermediate node 80c. The first terminal 84a is connected to the terminal 45d of the driver 45. The second terminal 84b is connected to the cathode 34b of the semiconductor light-generating device 34 and the terminal 45e of the driver 45. The anode 34a of the semiconductor light-generating device 34 is connected to the output 45c of the driver 45.

As described above with reference to FIGS. 6A to 6D, the light-generating circuit and the Peltier device are connected in series with each other and are arranged between the first and second power supplies for the light-generating circuit and Peltier device. In the control circuits 78a to 78d and the semiconductor laser module 1d, a current I flows in one of the Peltier device and the semiconductor light-generating device and driver, and then flows in the other of the Peltier device and the semiconductor light-generating device and driver. Therefore, the control circuits 78a to 78d and the semiconductor laser module 1d according to the embodiments have structures for reducing their respective power consumption.

Figure 7:
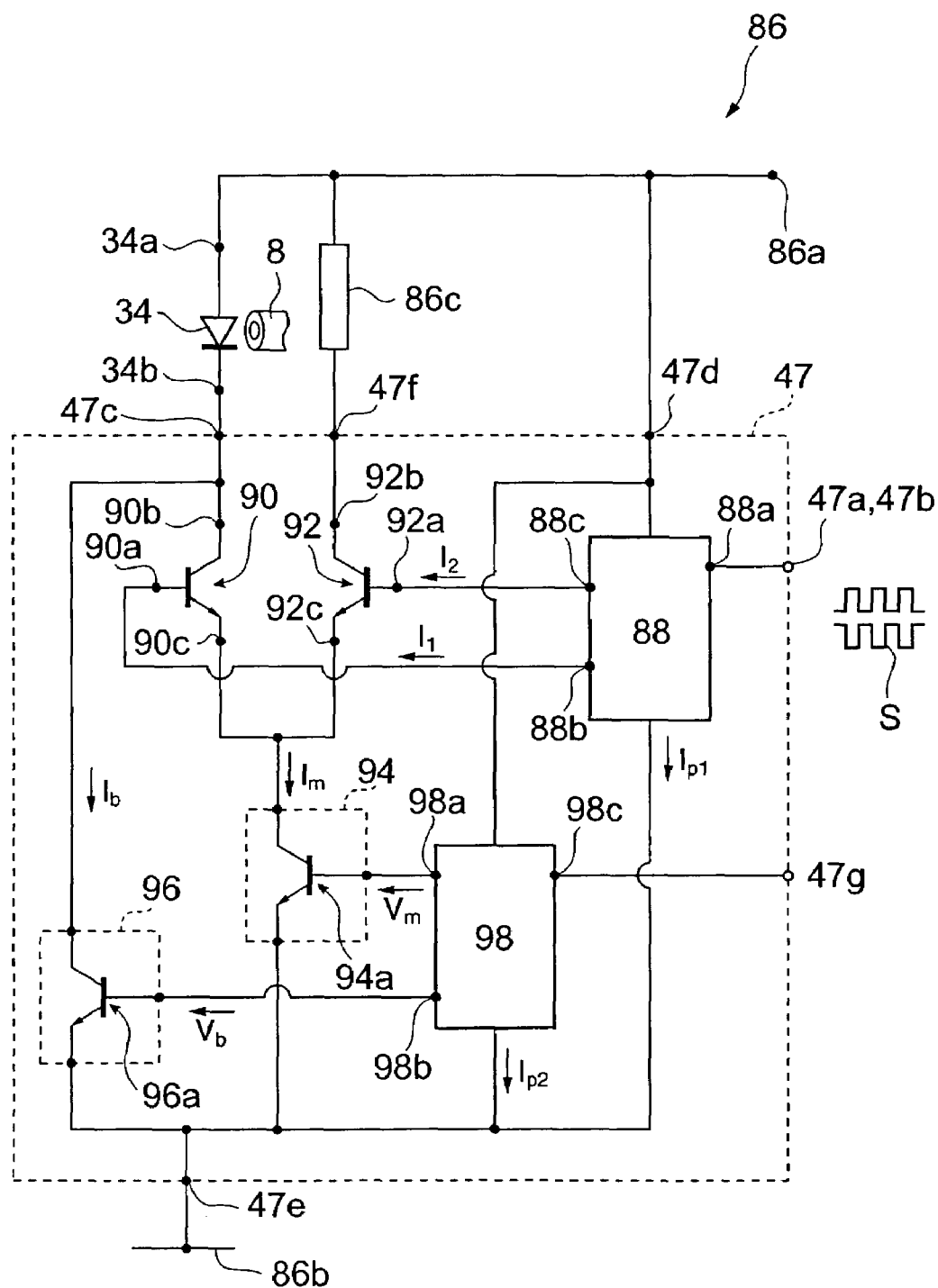
FIG. 7 is a circuit diagram showing a control circuit for a semiconductor laser module.

FIG. 7 is a circuit diagram showing the driver shown in FIGS. 6A and 6B. Referring to FIG. 7, a light-generating circuit 86 has a first node 86a and second node 86b. The driver 47 is connected to the first node 86a and the second node 86b therebetween. The driver 47 includes one or more inputs 47a and 47b, the first output 47c, a second output 47f, an amplification circuit 88, a first transistor 90, a second transistor 92, a first circuit 94, a second circuit 96, and a bias-current/modulation-current control circuit portion 98. The first circuit portion 94, the second circuit portion 96, and the bias-current/modulation-current controller 98 are connected to the first node 86a and the second node 86b therebetween.

In the driver 47, the amplification circuit 88 has inputs 88a, and outputs 88b and 88c. The inputs 88a receive signals S, such as complementary signals, at the inputs 47a and 47b. The outputs 88b and 88c provide a pair of driving signals $I_1$ and $I_2$ generated by the amplification circuit 88 from the signal S. A current $I_{p1}$ flows in the amplification circuit 88. The amplification circuit portion 88 has one or more amplification stages to generate the driving signals $I_1$ and $I_2$ from the signal S. The first transistor 90 has a control terminal 90a and first and second terminals 90b and 90c. The control terminal 90a receives the driving signal $I_1$. The first transistor 90 can control an electric current flowing between the first and second terminals 90b and 90c in response to the signal on the control terminal 90a. The second transistor 92 has a control terminal 92a and first and second terminals 92b and 92c. The control terminal 92a receives the driving signal $I_2$. The second transistor 92 can control a current flowing between the first and second terminals 92b and 92c in response to the signal on the control terminal 92a. The first output 47c is connected to the first terminal 90b of the first transistor 90. The second output 47f is connected to the first terminal 92b of the second transistor 92.

A first circuit 94 is connected to the second terminal 90c of the first transistor 90 and the second terminal 92c of the second transistor 92, and generates a modulation current Im for the paired transistors 90 and 92. The embodiment of the first circuit 94, illustrated as one example, will be described. The first circuit 94 can include a transistor 94a having a control terminal and first and second terminals. The second circuit 96 is connected to the first output 47c and generates a bias current Ib. The embodiment of the second circuit 96, illustrated as one example, will be described. The second circuit 96 can include a transistor 96a having a control terminal and first and second terminals. The bias-current/modulation-current controller 98 is connected to the first and second circuits 94 and 96 and generates a signal Vm for controlling the modulation current Im and a signal Vb for controlling the bias current Ib. These signals are supplied from outputs 98a and 98b. The bias-current/modulation-current controller 98 has an input 98c connected to a control input 47g. A current $I_{P2}$ flows in the bias-current/modulation-current controller 98.

The cathode 34b of the semiconductor light-generating device 34 is connected to the first output 47c. The anode 34a of the semiconductor light-generating device 34 is connected to the first node 86a. The second output 47f may be connected to the first node line 86a. According to a modification of the control circuit and the optical module, the light-generating circuit can further include a load 86c connected between the first node 86a and the second output 47f of the driver 47. For example, a resistor can be used as the load 86c.

Figure 8:
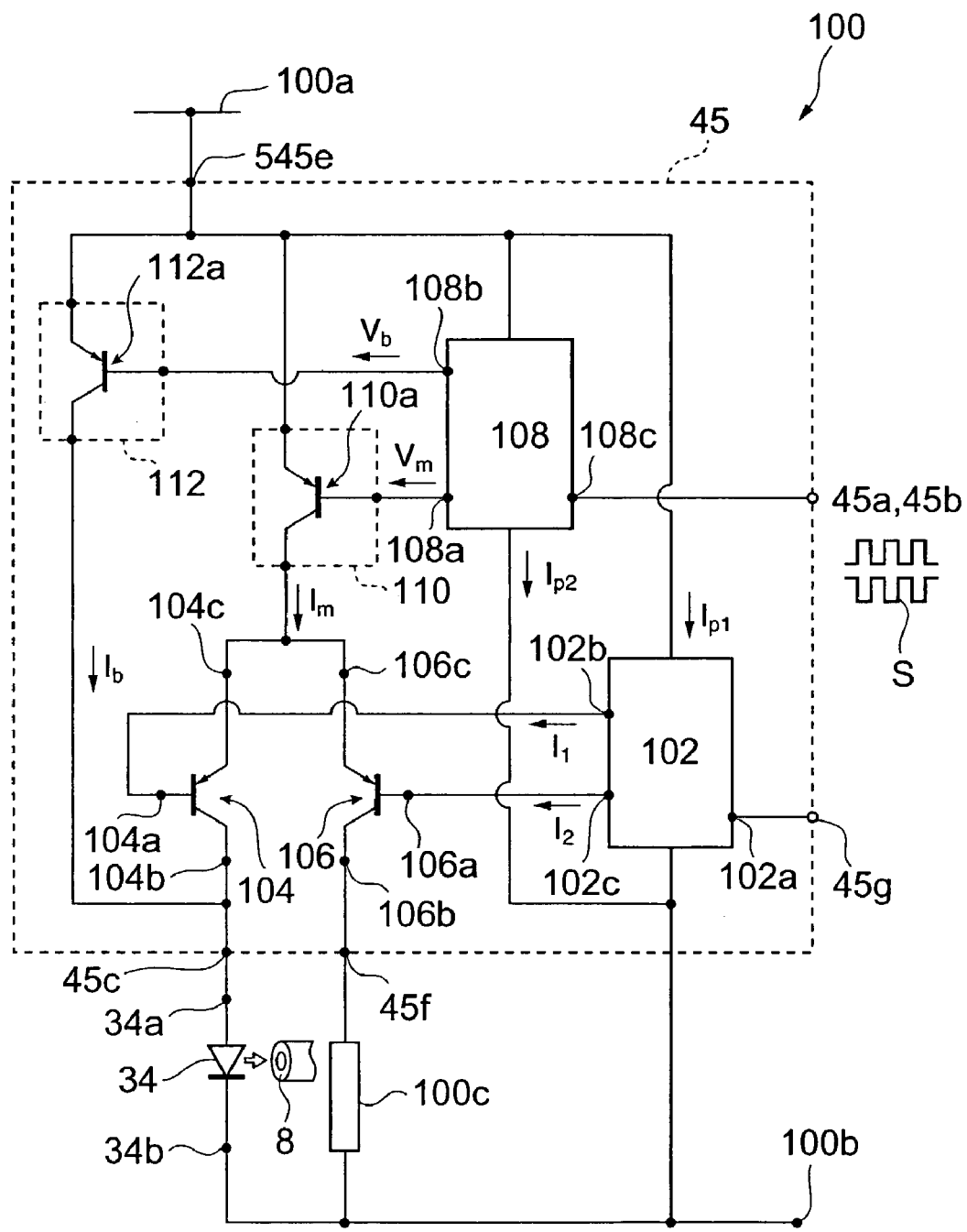
FIG. 8 is a circuit diagram showing a control circuit for a semiconductor laser module.

FIG. 8 is a circuit diagram showing the driver shown in FIGS. 6C and 6D. Referring to FIG. 8, a light-generating device circuit 100 has a first node 100a and a second node 100b. The driver 45 is connected to the first node 100a and the second node 100b therebetween. The driver 45 includes one or more inputs 45a and 45b, the first output 45c, a second output 45f, an amplification circuit 102, a first transistor 104, a second transistor 106, a first circuit 110, a second circuit 112, and a bias-current/modulation-current controller 108. The first circuit 110, the second circuit 112, and the bias-current/modulation-current controller 108 are connected to the first node 100a and the second node 100b therebwtween.

In the driver 45, the amplification circuit 102 has inputs 102a and outputs 102b and 102c. The inputs 102a receive the signals S, such as complementary signals, from the inputs 45a and 45b. The outputs 102b and 102c provide a pair of signals $I_1$ and $I_2$ generated from the signal S by the amplification circuit 102. The amplification circuit 102 has one or more stages to generate the driving signals $I_1$ and $I_2$ from the signal S. A current $I_{P1}$ flows in the amplification circuit 102. The first transistor 104 has a control terminal 104a and first and second terminals 104b and 104c. The control terminal 104a receives the driving signal $I_1$. The first transistor 104 controls a current flowing between the first and second terminals 104b and 104c in response to a signal on the control terminal 104a. The second transistor 106 has a control terminal 106a and first and second terminals 106b and 106c. The control terminal 106a receives the driving signal $I_2$. The second transistor 106 controls an electric current flowing between the first and second terminals 106b and 106c in response to a signal on the control terminal 106a. The first output 45c is connected to the first terminal 104b of the first transistor 104. The second output 45f is connected to the second terminal 106b of the second transistor 106.

The first circuit 110 is connected to the second terminal 104c of the first transistor 104 and the second terminal 106c of the second transistor 106, and generates the modulation current Im for the paired transistors 104 and 106. The embodiment of the first circuit 110, illustrated as one example, will be described. The first circuit 110 can include a transistor 110a having a control terminal and first and second terminals. The second circuit 112 is connected to the first output 45c, and generates the bias current Ib. The embodiment of the second circuit 112, illustrated as one example, will be described. The second circuit 112 includes a transistor 112a having a control terminal and first and second terminals. The bias-current/modulation-current controller 108 is connected to the first circuit 110 and the second circuit 112, and generates the signal Vm for controlling the modulation current Im and the signal Vb for controlling the bias current Ib. These signals are supplied at outputs 108a and 108b. The biascurrent/modulation-current controller 108 has inputs 108c connected to control inputs 45g. The current $I_{P2}$ flows in the bias-current/modulation-current controller 108.

The anode 34a of the semiconductor light-generating device 34 is connected to the first output 45c. The cathode 34b of the semiconductor light-generating device 34 is connected to the second node 100b. The second output 45f is connected to the second line 10b. According to one modification of the control circuit and the optical module, the light-generating circuit can further include a load 100c connected between the second node 100b and the second output 45f of the driver 45. For example, a resistor can be used as the load 100c.

In the control circuit and the optical module shown in FIGS. 7 and 8, a current flows in one of the Peltier device and the driver and semiconductor light-generating device, and then flows in the other of the Peltier device and the driver and semiconductor light-generating device.

Fifth Embodiment

Figure 9A:
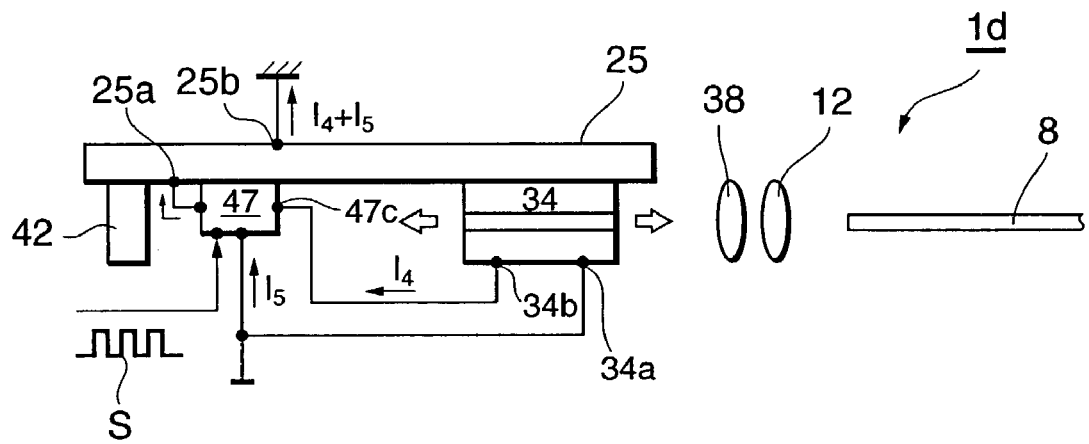
FIG. 9A is a schematic diagram of the semiconductor laser module shown in FIG. 1, and FIGS. 9B and 9C are schematic diagrams of other semiconductor laser modules for a control circuit.
Figure 9B:
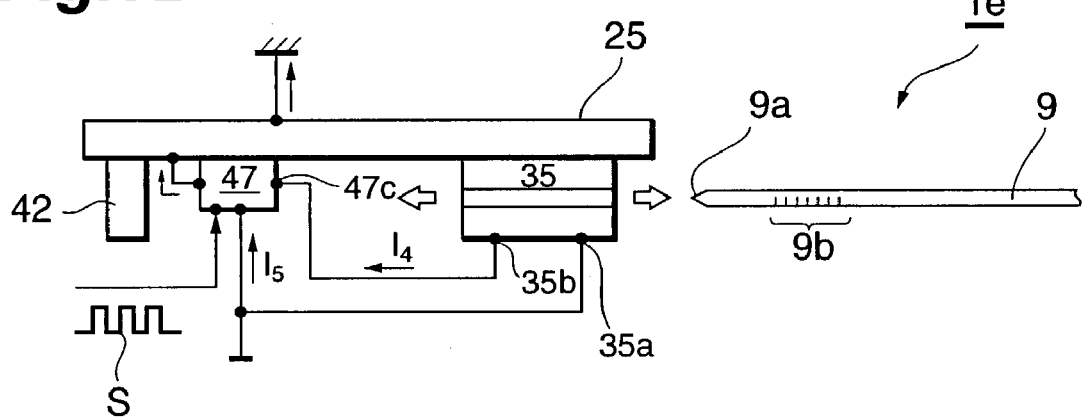
Figure 9C:
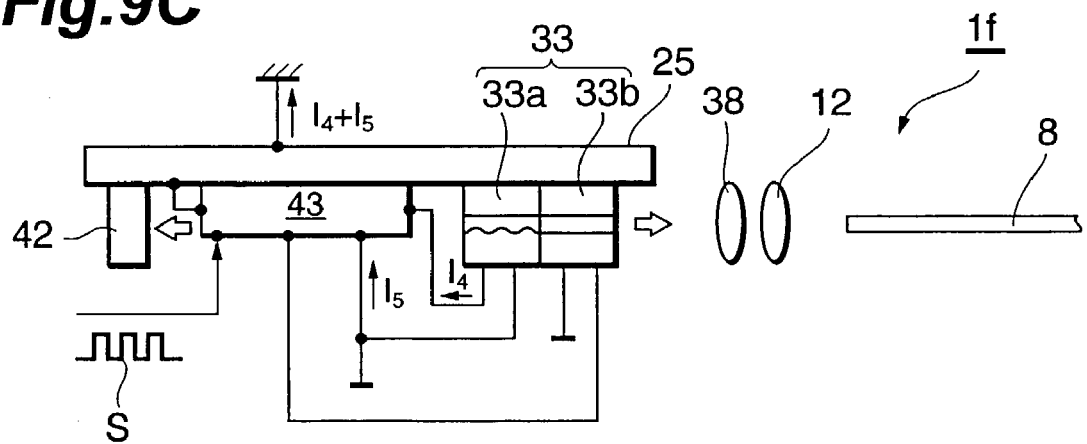

FIGS. 9A to 9C are schematic diagrams showing embodiments of optical modules to which control circuits for optical modules can be applied. FIG. 9A is a schematic diagram of the semiconductor laser module shown in FIG. 5. FIGS. 9B and 9C are schematic diagrams of other semiconductor laser modules for the control circuits shown in FIGS. 2 and 3.

FIG. 9A shows a semiconductor laser module 1d. The semiconductor laser module 1d includes a semiconductor light-generating device 34, such as a semiconductor laser device. The Peltier device 25 can control the temperatures of the semiconductor light-generating device 34 and a driver 47. Both current $I_4$ flowing in the semiconductor light-generating device 34 and current $I_5$ flowing in the driver 47 flow in the Peltier device 25. The semiconductor light-generating device 34 and the driver 47 are mounted on the Peltier device 25. If currents flowing in the semiconductor light-generating device 34 and the driver 47 increase and thus the semiconductor light-generating device 34 and the driver 47 generate more heat, than the cooling capability of the Peltier device 25 increases.

FIG. 9B shows a laser module 1e with an external cavity. The semiconductor laser module 1e includes a semiconductor light-generating device 35, such as a semiconductor optical amplifier, and an optical waveguide 9. The semiconductor light-generating device 35 is optically coupled to one end 9a of the optical waveguide 9, such as a grating fiber. The optical waveguide 9 includes a grating 9b. The optical cavity is constituted by one end face of the semiconductor light-generating device 35 and the grating 9b. The temperatures of the semiconductor light-generating device 35 and the driver 47 are controlled by the Peltier device 24. Both current $I_4$ flowing in the semiconductor light-generating device 35 and current $I_5$ flowing in the driver 47 flow in the Peltier device 25. The semiconductor light-generating device 35 and the driver 47 are mounted on the Peltier device 25. As currents flowing in the semiconductor light-generating device 35 and the driver 47 increase and thus the semiconductor light-generating device 35 and the driver 47 generate more heat, then the cooling capability of the Peltier device 25 also increases.

FIG. 9C shows a semiconductor laser module if. The semiconductor laser module 1f includes a semiconductor light-generating device 33, such as a semiconductor optical integrated device. The temperatures of the semiconductor light-generating device 33 and a driver 43 are controlled by the Peltier device 25. The semiconductor light-generating device 33 includes a laser portion 33a and a modulation portion 33b. The laser portion 33a steadily generates light. The modulation portion 33b is optically coupled to the laser portion 33a and modulates the light generated by the laser portion 33a. The modulated light is supplied from the modulation portion 33b to an optical fiber 8. The current $I_4$ flowing in the laser portion 33a of the semiconductor light-generating device 33 and the current $I_5$ flowing in the driver 43 flow in the Peltier device 25. The semiconductor light-generating device 33 and the driver 43 are mounted on the Peltier device 25. As currents flowing in the semiconductor light-generating device 33 and the driver 43 increase and the heat generated by the semiconductor light-generating device 33 and the driver 43 increase, the cooling capability of the Peltier device 25 increases.

Each of the optical modules shown in FIGS. 9A to 9C can include a Peltier device control device 60 as shown in FIGS. 4B and 4C. The optical modules shown in FIGS. 9A to 9C can be realized by the embodiment shown in FIG. 5, but the present invention is not limited thereto.

Although the principle of the present invention has been described in the preferred embodiments with reference to the accompanying drawings, it is obvious to those skilled in the art that the present invention can be changed in arrangement and detail without departing from such principles. For example, a semiconductor light-generating device may be any one of semiconductor laser, semiconductor optical amplifier, and semiconductor optical integrated device. The semiconductor optical amplifier is provided so as to be optically coupled to a grating optically coupled to an optical waveguide, thereby forming an external cavity. The light-generating device portion of the semiconductor optical integrated device can include a DFB type light-generating element portion or Fabry-Perot type light-generating element portion. The modulation device portion of the semiconductor optical integrated device can include an EA type modulating element portion. Although the circuits using bipolar transistors have been described, other types of transistors such as field-effect transistors can be used. We therefore claim all modifications and variations coming within the spirit and scope of the following claims.

What is claimed is:

1. An optical device control circuit for a light-generating module, comprising:
    first and second power supplies;
    a semiconductor light-generating device;
    a power controller for controlling current flowing in said semiconductor light-generating device; and
    a Peltier device for controlling a temperature of said semiconductor light-generating device,
    wherein said semiconductor light-generating device and said Peltier device are electrically connected in series between first and second power supplies.

2. The circuit according to claim 1, further comprising a Peltier driver connected to an intermediate node between said semiconductor light-generating device and said Peltier device for controlling current flowing in said Peltier device.

3. The circuit according to claim 2, wherein said Peltier driver comprises a current supply, a current sink, and a controller, said current supply supplying current to said node, said current sink sinking current from said node, and said controller controlling said current supply and said current sink.

4. The circuit according to claim 1, wherein said power controller comprises an output driver connected to an intermediate node between said semiconductor light-generating device and said Peltier device for driving said semiconductor light-generating device.

5. The circuit according to claim 4, wherein said output driver includes a modulation current driver and a bias current driver for driving said semiconductor light-generating device.

6. An optical module comprising:
a housing having first and second power supply terminals;
a Peltier device provided in said housing;
a semiconductor light-generating device provided on said Peltier device;
an optical waveguide optically coupled to said semiconductor light-generating device; and
a power controller provided in said housing, said power controller being connected to said semiconductor light-generating device,
wherein said semiconductor light-generating device and said Peltier device are electrically connected in series between said first and second power supply terminals, and
wherein said semiconductor light-generating device includes a semiconductor laser device.

7. The optical module according to claim 6, further comprising a Peltier driver connected to a node between said semiconductor light-generating device and said Peltier device,
wherein said Peltier driver includes a current supply, a current sink, and a controller,
wherein said current supply supplies a current to flow in said Peltier device,
wherein said current sink sinks a current flowing in said semiconductor light-generating device, and
wherein said controller controls said current supply and said current sink.

8. The optical module according to claim 6, further comprising a first semiconductor device, a second semiconductor device, and a control device,
wherein said first semiconductor device is connected to a node between said semiconductor light-generating device and said Peltier device and supplies current to the node,
wherein said second semiconductor device is connected to said node and sinks current from said node,
wherein said control device controls said first and second semiconductor devices.

9. An optical module comprising:
a housing having first and second power supply terminals;
a Peltier device provided in said housing;
a semiconductor light-generating device provided on said Peltier device;
an optical waveguide optically coupled to said semiconductor light-generating device;
a grating optically coupled to said optical waveguide; and
a power controller provided in said housing, said power controller being connected to said semiconductor light-generating device,
wherein said semiconductor light-generating device and said Peltier device are electrically connected in series between said first and second power supply terminals, and
wherein said semiconductor light-generating device includes a semiconductor optical amplifier.

10. The optical module according to claim 9, further comprising a Peltier driver connected to a node between said semiconductor light-generating device and said Peltier device,
wherein said Peltier driver includes a current supply, a current sink, and a controller,
wherein said current supply supplies current to flow in said Peltier device,
wherein said current sink sinks current flowing in said semiconductor light-generating device, and wherein said controller controls said current supply and said current sink.

11. The optical module according to claim 9, further comprising a first semiconductor device, a second semiconductor device, and a control device,
wherein said first semiconductor device is connected to a node between said semiconductor light-generating device and said Peltier device,
wherein said first semiconductor device supplies current to said node,
wherein said second semiconductor device is connected to said node
wherein said second semiconductor device sinks current from said node, and
wherein said control device controls said first and second semiconductor devices.

12. An optical module comprising:
a housing having first and second power supply terminals;
a Peltier device provided in said housing;
a semiconductor light-generating device provided on said Peltier device;
an optical waveguide optically coupled to said semiconductor light-generating device; and
a power controller provided in said housing, said power controller being connected to said semiconductor light-generating device,
wherein said semiconductor light-generating device includes a light-generating device portion and a modulation portion optically coupled to said light-generating device portion, and
wherein said semiconductor light-generating device portion and said Peltier device are electrically connected in series between the first and second power supply terminals.

13. The optical module according to claim 12, further comprising a Peltier driver connected to a node between said semiconductor light-generating device and said Peltier device,
wherein said Peltier driver includes a current supply, a current sink, and a controller,
wherein said current supply supplies current to flow in said Peltier device,
wherein said current sink sinks current flowing in said semiconductor light-generating device, and
wherein said controller controls said current supply portion and said current sink portion.

14. The optical module according to claim 12, further comprising a first semiconductor device, a second semiconductor device, and a control device,
wherein said first semiconductor device is connected to a node between said semiconductor light-generating device and said Peltier device,
wherein said first semiconductor device supplies current to said node,
wherein said second semiconductor device is connected to said node,
wherein said second semiconductor device sinks a current from said node, and
wherein said control device controls said first and second semiconductor devices.

15. An optical device control circuit comprising:
first and second power supplies;
a light-generating circuit including at least one input, a semiconductor light-generating device, and a driver for driving said semiconductor light-generating device by a signal received at said at least one input; and
a Peltier device for controlling a temperature of said semiconductor light-generating device,
wherein said Peltier device and said light-generating circuit is electrically connected in series with each other between said first and second power supplies.

16. The circuit according to claim 15, wherein said light-generating circuit is electrically connected between said first power supply and an intermediate node, and
wherein said Peltier device is electrically connected between said intermediate node and said second power supply.

17. The circuit according to claim 16, wherein said semiconductor light-generating device provides first and second terminals, said first terminal being connected to said driver and said second terminal being electrically connected to said first power supply.

18. The circuit according to claim 16, wherein said semiconductor light-generating device provides first and second terminals, said first terminal being connected to said driver and said second terminal being electrically connected to said intermediate node.

19. The circuit according to claim 15, wherein said light-generating circuit is electrically connected between said second power supply and an intermediate node, and
wherein said Peltier device is electrically connected between an intermediate node and said first power supply.

20. The circuit according to claim 19, wherein said semiconductor light-generating device provides first and second terminals, said first terminal being connected to said driver and said second terminal being electrically connected to said second power supply.

21. The circuit according to claim 19, wherein said semiconductor light-generating device provides first and second terminals, said first terminal being connected to said driver and said second terminal being electrically connected to said intermediate node.

22. The circuit according to claim 15, wherein said light-generating circuit comprises first and second internal nodes,
said driver being connected between said first and second internal nodes to receive power and said light-generating device provides first and second terminals,
wherein the driver comprises:
an amplification circuit for generating a pair of driving signals from a signal received at said input,
a first transistor having a control terminal and first and second current terminals;
a second transistor having a control terminal and first and second current terminals,
a first circuit for generating a modulation current, said first circuit being connected to one of said first and second current terminals of said first transistor and being connected to one of said first and second current terminals of said second transistor,
a first output connected to the other of said first and second current terminals of said first transistor,
a second output connected to the other of said first and second current terminals of said second transistor,
a second circuit, connected to said first output for generating a bias current, and
a bias-current/modulation-current controller connected to said first and second circuits,
wherein said first terminal of said semiconductor light-generating device is electrically connected to said first output,
wherein said second terminal of said semiconductor light-generating device is electrically connected to said first internal node, and
wherein said second output is electrically connected to said first internal node.

23. The circuit according to claim 22, wherein said light-generating circuit further comprises a load electrically connected between said first internal node and said second output of said driver.

24. An optical module comprising:
a housing having first and second power supply terminals;
a Peltier device provided in said housing;
a semiconductor light-generating device provided on said Peltier device;
a driver electrically connected to said semiconductor light-generating device; and
an optical waveguide optically coupled to said semiconductor light-generating device,
wherein said Peltier device are electrically connected in series to said semiconductor light-generating device and said driver between said first and second power supply terminals, and
wherein said semiconductor light-generating,
device includes a semiconductor laser.

25. The optical module according to claim 24, wherein said driver is mounted on said Peltier device.

26. An optical module comprising:
a housing having first and second power supply terminals;
a Peltier device provided in said housing;
a semiconductor light-generating device provided on said Peltier device;
a driver electrically connected to said semiconductor light-generating device;
an optical waveguide optically coupled to said semiconductor light-generating device; and
a grating optically coupled to said optical waveguide,
wherein said Peltier device and said semiconductor light-generating device and driver are electrically connected in series between said first and second power supply terminals, and
wherein said semiconductor light-generating device includes a semiconductor optical amplifier.

27. The optical module according to claim 26, wherein said driver is mounted on said Peltier device.

28. An optical module comprising:
a housing having first and second power supply terminals;
a Peltier device provided in said housing;
a semiconductor light-generating device provided on said Peltier device;
a driver electrically connected to said semiconductor light-generating device; and
an optical waveguide optically coupled to said semiconductor light-generating device,
wherein said semiconductor light-generating device includes a light-generating portion and a modulation portion optically coupled to said light-generating portion, and
wherein said Peltier device are electrically connected in series to said semiconductor light-generating device and said driver between said first and second power supply terminals.

29. The optical module according to claim 28, wherein said driver is mounted on said Peltier device.

* * * * *